United States Patent [19]

Benjamin et al.

[11] 4,357,540

[45] Nov. 2, 1982

[54] SEMICONDUCTOR DEVICE ARRAY MASK INSPECTION METHOD AND APPARATUS

[75] Inventors: Charles E. Benjamin; David J. Crawford, both of Poughkeepsie, N.Y.

[73] Assignee: International Business Machines Corporation, Armonk, N.Y.

[21] Appl. No.: 218,322

[22] Filed: Dec. 19, 1980

[51] Int. Cl.³ .............................................. H01J 37/00
[52] U.S. Cl. ................................ 250/491.1; 250/492.2
[58] Field of Search ....................... 250/491, 492.2, 398

[56] References Cited

U.S. PATENT DOCUMENTS

| | | | |
|---|---|---|---|
| 3,670,404 | 6/1972 | Kamoshida | 250/492.2 |
| 3,683,195 | 8/1972 | Johannsmeier et al. | 250/492.2 |
| 3,742,229 | 6/1973 | Smith et al. | |
| 3,795,452 | 3/1974 | Bourdelais et al. | |
| 3,874,916 | 4/1975 | Livesay et al. | |
| 3,875,416 | 4/1975 | Spicer | |
| 3,901,814 | 8/1975 | Davis et al. | 250/492.2 |
| 3,908,118 | 9/1975 | Micka | |
| 4,123,661 | 10/1978 | Wolf et al. | 250/492.2 |
| 4,137,459 | 1/1979 | Albrecht et al. | 250/492.2 |
| 4,149,085 | 4/1979 | Davis et al. | 250/492.2 |

*Primary Examiner*—Bruce C. Anderson
*Attorney, Agent, or Firm*—Francis J. Thornton

[57] ABSTRACT

This describes an automatic beam alignment and defect inspection system for masks. The system causes each field or sub-field to be individually aligned for inspection irrespective of the previous alignment of the mask or any other field or sub-field. This is accomplished by scanning a preselected portion of each field of sub-field, with a beam and adjusting the position of the deflection based on the reflected signal while scanning a pre-established portion of the selected field or sub-field. In this way a portion of each selected field or sub-field is used as an alignment mark and stepping errors avoided.

Once alignment is achieved a beam spot, comparable to the size of the minimum defect to be detected is scanned over the selected field or sub-field with an overlapping scan to find defects such as mask material in improper places or points where the mask material is missing.

10 Claims, 10 Drawing Figures

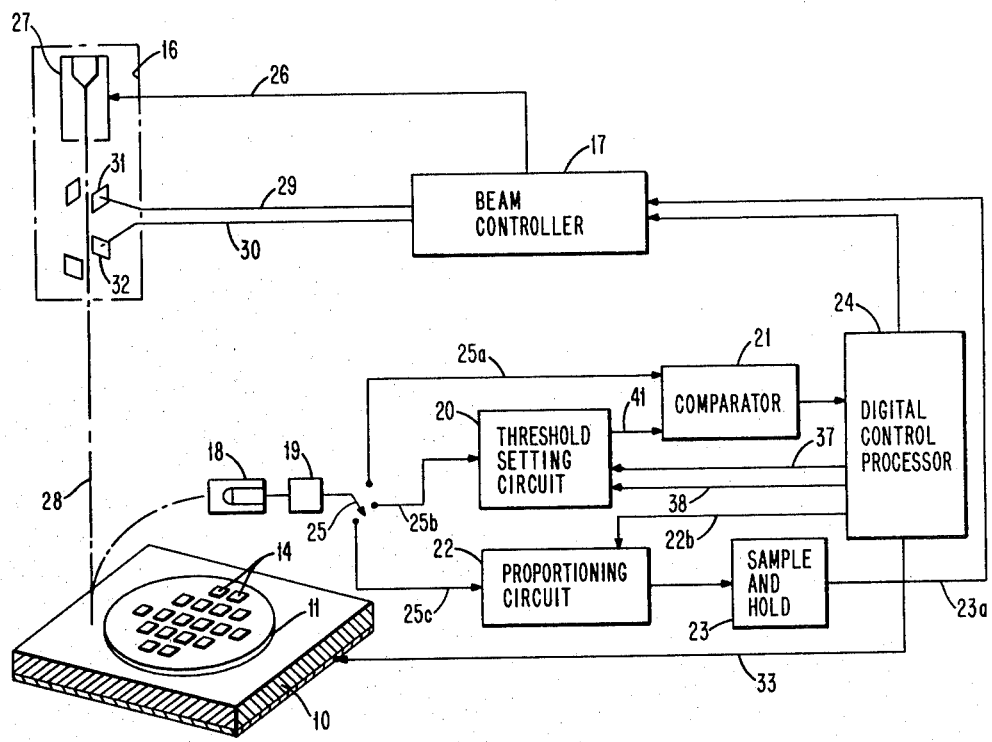
FIG. 1
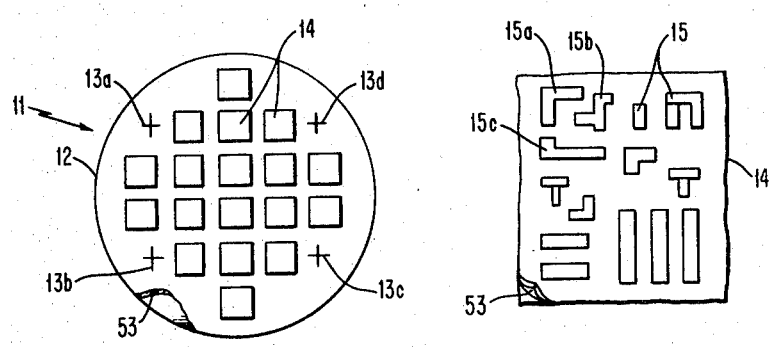
FIG. 2
FIG. 3

4,357,540

SEMICONDUCTOR DEVICE ARRAY MASK INSPECTION METHOD AND APPARATUS

FIELD OF THE INVENTION

This invention relates to a method and an apparatus for automatic inspection, testing, measurement, and verification of high contrast image patterns.

RELATED APPLICATION

A co-pending application entitled "Electron Beam Mask Inspection Tool Method and Apparatus," Ser. No. 218,323 filed Dec. 19, 1980, is related to the subject matter of this application.

BACKGROUND OF THE INVENTION

The basic economic advantages that can be realized from automating mask alignment procedures in mask defect inspections have been projected many times in the past but technically workable solutions have not been set forth. In the prior art the positioning and inspection of such masks has generally been performed by individual operators at microscopes with the operators being trained to recognize and manually position the masks and to manually position and measure on a statistical sampling basis different types of geometrical defects in the mask. By using a statistical sampling method less than 100% inspection occurs. The inspection costs are minimized but yield is effective only to the degree of accuracy of the statistical basis used for the inspection.

Previous attempts to automate mask alignment procedures in mask defect inspections have been unsuccessful primarily because of the difficulty in avoiding erroneous defect indications caused by positional errors between the respective areas on the masks which occur due to stepping errors in the production equipment used to create the mask. Such prior inventions did not provide means for resolving this stepping error from defects or other variations in the masks, especially when multiple, complex mask geometries were to be aligned or inspected.

The present invention resolves or avoids these difficulties and is an automatic alignment and defect inspection system for semiconductor device masks. This invention relies on the measurement of either reflected or transmitted light, reflected or secondary electrons, or back-scattered currents when a controllable beam is selectively addressed onto the mask with controlled field alignment and especially on specified utilitarian aspects of the mask which can be used as the alignment target for the controlled field alignment.

The present invention can be further improved if after alignment of each area to be measured, each measurement overlaps the previous measurement.

Still further the present invention achieves a significant improvement over the prior art for it compares the measured data against the original design data thus obtaining an accuracy of approximately 100 percent with higher resolution geometries.

SUMMARY OF THE INVENTION

In the present invention, the mask contains a number of alignment marks. The mask, to be inspected, is mounted in a stepping fixture and grossly aligned by reference to one or more gross alignment marks, contained therein. By reference to other alignment marks each selected field, subfield or unit area of the mask can be precisely located with respect to an inspection position and measured regardless of variations between each field sub-field or unit area or any other previously aligned field sub-field or unit area or the gross alignment mark itself. The invention can use each pattern to be inspected as its own final precise alignment mark. This invention thus renders the system insensitive to stepping problems or errors in the making of the mask, and permits the measurement and inspection of complex arrays with fiducials and test sites as well as simple arrays with gross interconnection patterns.

The use of the invention achieves easy, inexpensive 100% inspections and permits handling high resolution geometries and produces higher yields due to the better accuracy of the inspection process than any known to the prior art.

Broadly speaking the invention comprise the steps of:

placing a patterned mask to be inspected in the inspection apparatus, directing an optical or an electron beam to scan over a first selected region of the mask which region overlies the edge of a selected first pattern, measuring and storing the reflected information generated by the beam in said region, directing the beam so it scans over a second selected region of the mask overlying a second edge of said first pattern, said second edge being parallel to said first edge, measuring the reflected information generated by the beam in said second region, using said measured information to align the said first pattern to a predetermined inspection position, and directing the beam so it scans over the entire selected region to detect defective areas and verify the accuracy of non-defective areas in said region by comparing the measured data with the stored data in the inspection system which represents the mask design.

Once this is complete the mask may be moved so that the electron beam can repeat the scanning and alignment step above to align each region on said mask to said inspection position and inspect each said region. In this way the location of defects can be found and recorded at the same time that the mask pattern itself is verified.

When an electron beam is used a conductive layer or overcoat is first applied over the substrate of the mask to assure excess electrons are not accumulated on the mask.

DESCRIPTION OF THE DRAWING

FIG. 1 shows in schematic form an apparatus embodying the present invention;

FIG. 2 illustrates an overall photomask of the type to be inspected;

FIG. 3 illustrates a typical field of the photo mask being inspected;

DETAILED DESCRIPTION

Figure 4:
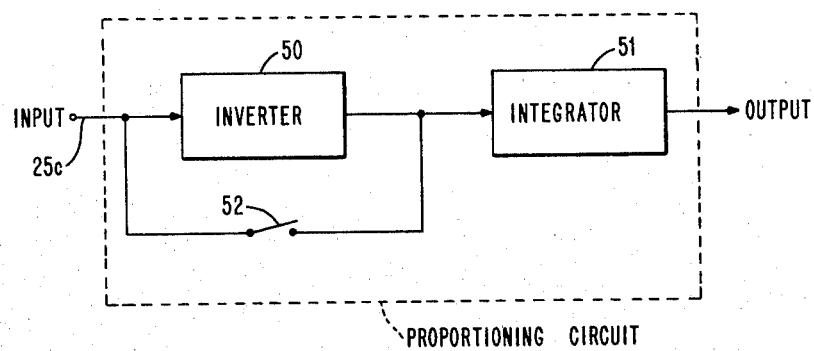
FIG. 4 schematically illustrates the proportioning circuit used in the present invention.

An illustrative arrangement of one of the possible methods and apparatus for positioning and inspecting masks in accordance with the teachings of the invention is shown in FIG. 1. Here a suitable XY positioning table 10 has a mask 11 to be inspected, placed thereon. This mask 11, shown in FIG. 2, generally comprises a substrate 12 having both gross alignment marks 13a, 13b, 13c and 13d each of which is in the form of crosses, chevrons or the like and a plurality of repeated fields 14 thereon.

It should be clearly understood that many masks are known to the industry. For example, optically transmissive masks formed of glass with optically opaque materials such as metals or dyes can be used. Also the mask substrates could be comprised of material such as silicon which is transparent to infrared. For illustrative purposes only, in the present embodiment, it will be assumed that the substrate 12 is formed of a glass and the patterns 15 are formed of thin metal films deposited on the glass.

Each field, as shown in FIG. 3, is comprised of a number of different geometric, metallized patterns 15 deposited on the substrate. Each field is usually, but not necessarily identical to every other field. It should be understood that the present invention can inspect masks in which each field to be inspected is different from every other field to be inspected. Thus, each mask can have, thereon, a multiplicity of design patterns plus parameter control test patterns on the same mask. Such masks are common, well known and widely used in the semiconductor industry.

The positioning and testing apparatus of FIG. 1 comprises a controllable electron beam apparatus 16, a beam controller 17, an electron detector 18, an amplifier 19, a threshold setting circuit 20, a comparator circuit 21, a proportioning circuit 22, a sample and hold circuit 23, a digital control processor 24 and a switch 25 which serves to connect the detector 18 and amplifier 19 to either the comparator 21, the threshold setting circuit 20 or to the proportioning circuit 22. The control processor 24, may include any suitable general purpose computer, such as a system 7 or series 1 sold by the IBM Corporation. This processor contains all the information pertaining to the mask to be inspected. It contains all details of the mask. It would contain information as to all alignment marks as well as all information as to the detailed shape and position of the patterns 15. This processor also generates signals that drives the beam controller 17 which controls, via line 26, the electron beam source 27 to turn the electron beam 28 on and off. The controller 17 further controls, via lines 29 and 30, the beam deflection plates 31 and 32 which control the position of the electron beam 28 on the mask. The processor 24 also controls via line 33 the position of the XY table 10. It should be noted however, that the length of scan of such an electron beam equipment may be relatively small and scan only a part, i.e. a subfield of a selected one of the fields 14.

The mask to be inspected is held on the XY positioning table 10 by suitable jigs or holding apparatus (not shown). In this described embodiment to assure that the electron beam does not charge either the material forming the patterns 15a, 15b, 15c, etc. or the substrate itself, while it scans these areas, a thin, grounded, conductive, transparent layer 53, as shown in FIGS. 1 and 3, may be deposited over the substrate. It has been found that thin conductive glasses or glass like materials, such as a 2000 angstroms thick layer of tin-oxide, are particularly suitable for this purpose. When the substrate is conductive or semiconductive, layer 53 is not necessarily required. Also this layer 53 is not required if a non-charging beam such as light beam is used.

Initially the switch 25 is set to connect the detector 18 and amplifier 19 to the threshold setting circuit 20 via line 25b and the processor 24 set to cause the controller 17 to turn on beam 28. The beam 28 is held in a fixed position and the table 10 is caused to move beneath the beam 28 such that the beam will randomly scan or traverse the mask and fields 14. As the mask passes beneath the beam, the impinging of the beam, on the conductive glass layer 53 on the substrate 12, and on the various patterns 15 deposited on the glass layer 53, causes either secondary electrons to be emitted or backscattering of electrons from the beam. Each of the materials, i.e. the glass layer 53 or the material of the patterns emits different levels of either secondary electrons or back-scattered electrons.

Figure 5:
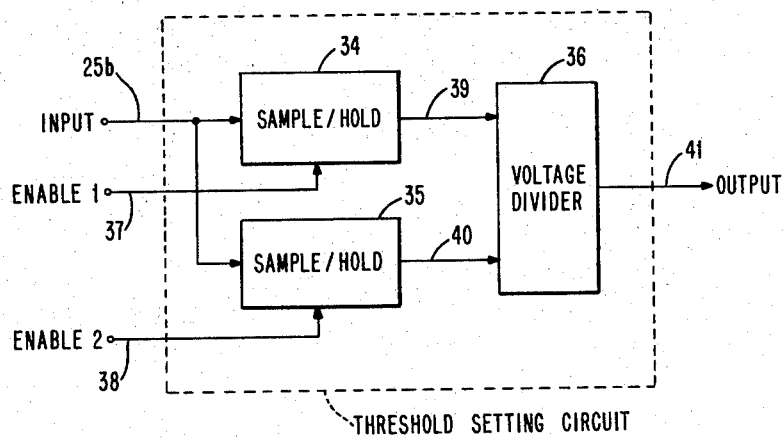
FIG. 5 schematically illustrates the threshold setting circuit used in the present invention.

Thus, for example, the glass layer 53 will give rise to one level of secondary electrons, usually low, while the patterns in the field will give rise to a different level, usually higher. Henceforth for convenience only, the detection of secondary electrons will be described even though the apparatus could utilize back-scattered electrons. The beam is now caused to scan across the selected field. As the beam traverses the field different levels of secondary electrons are created by the beam impinging on the conductive glass layer 53 and the patterns. These secondary electrons are detected by the detector 18 which produces a signal proportional to the number of secondary electrons detected. This signal is amplified by amplifier 19 and transmitted to the threshold setting circuit 20. This threshold setting circuit 20 is comprised of a pair of sample and hold circuits 34 and 35 and a voltage divider 36 as shown in FIG. 5.

The beam is first directed against the glass layer 53 and an enable signal from the processor is sent via line 37 to the sample and hold circuit 34 to cause the sample and hold circuit 34 to turn on. After a predetermined time the enable signal to the sample and hold circuit 34 is shut off. The beam is then directed to a pattern area and a second enable signal is sent to sample and hold circuit 35 via line 38. This procedure is used to calibrate the detector threshold for a particular mask.

The outputs of these sample and hold circuits are transferred to a voltage divider circuit 36 via line 39 and 40. The output of the voltage divider which is approximately one-half way between the two outputs of the sample and hold circuits is set into the comparator circuit 21 and acts as a threshold voltage against which signals on line 25c are to be compared. This threshold level is thus established dynamically and is based upon the average value of the different signal strengths created by the detected secondary electrons from both the glass areas, where the pattern is absent, and the areas where the patterns are present. This establishment of a threshold level becomes important especially when the return signal is noisy and subject to variations due to density variations, geometric defects or circuit drift.

This threshold level can be periodically adjusted to account for variations in beam current, or changes in the signal received because of variations in the target such as pattern thickness or density or the like.

If desired, the apparatus of FIG. 1 can be supplied with an optical binocular microscope (not shown) and the mask can be roughly aligned by visual observation of the gross alignment marks 13a, 13b, 13c and 13d. Once the mark has been roughly aligned through use of the gross alignment marks, the information contained in the processor 24 is now used to activate the beam source 16 and move the table 10. Hence the mask moves a fixed known distance and direction so that the beam is located over the area of a selected one of said fields 14. The beam is now caused ot traverse the selected field or sub-field.

Figure 6:
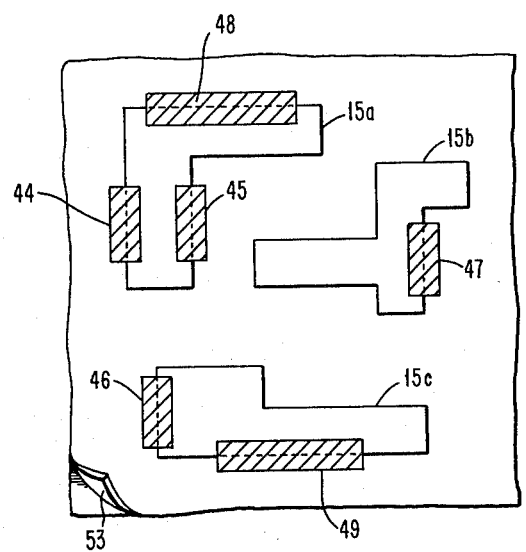
FIG. 6 illustrates a portion of the field of FIG. 3 being used for alignment.

Exact registration of each field to a final fixed predetermined inspection position is now accomplished by scanning selected ones of the patterns 15 in a sub-field or portion of the selected field 14. The preselected portion may be designed for alignment purposes only and repeated from field to field or it may be part of the field pattern itself and therefore, could be different for each unique field pattern. The actual patterns to be scanned for this precision registration may be an preselected portion of the field. For example, as shown in FIG.6 three distinct patterns 15a, 15b and 15c appearing in the upper left hand corner of the field 14 of FIG. 3 will be used and referred to as a sub-field in the following example. The switch 25 is now set to couple the proportioning crcuit 22 to the detector 18 via line 25c and amplifier 19. The processor 24 via the controller 17 now causes the beam to scan portions of the selected edges of each of the patterns 15a, 15b and 15c in order to locate these patterns relative to a desired inspection position. Once the actual position of these selected patterns is determined the proportioning circuit 22, via sample and hold circuit 23 and line 23a imposes a position correction on the beam controller to cause the beam 28 to be adjusted in position such that, with respect to a moving position of the beam, the entire selected field will be in the desired inspection position.

By causing the beam to traverse a region overlapping an edge of the pattern and integrating the signal returning from thsi scan along the edge of the pattern and then reversing the signal polarity and then causing the beam to traverse an equal length scan on an opposite edge of a pattern and integrating this signal and summing these integrated signals an error term can be generated that represents the displacement of the image from the desired position to which the sub-field is to be aligned. This displacement is independent of the size error contributions. Thus a scan is for example, first performed on the left edge, i. e. the horizontal direction of pattern 15 as shown by the shaded area 44 of FIG. 6. This scan generates secondary electrons from both the pattern and the glass which are detected by detector 18 and the signal generated is fed into the proportioning circuit 22.

As shown in FIG. 4 the proportioning circuit is comprised of an inverter circuit 50, an integrator circuit 51 and a switch 52 controlled by the digital control processor 24 via line 22b. The closing of switch 52 removes the inverter circuit from the proportioning circuit.

Before scanning the area 44 the switch 52 is opened. The beam is now activated to scan back and forth across the edge of the pattern 15a. The area scanned has a width W and a distance L, and is shown as the shaded area 44. The signal from this scan is picked up by the detector 18 and is fed via line 25a into the proportioning circuit. The inverter 50 inverts this input signal and applies it to the integrating circuit 51 whose output on line 22 is connected to the sample and hold circuit 23.

Figure 8:
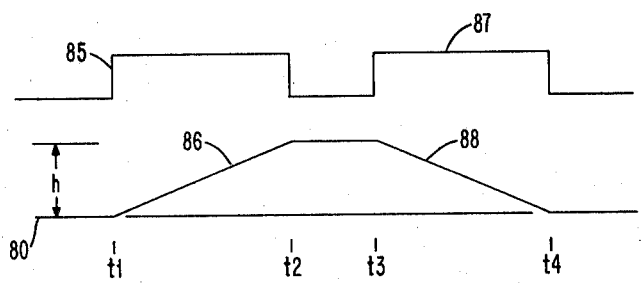
FIG. 8 illustrates the input and output signals of selected ones of the scans of FIG. 4.

As shown, in FIG. 8, the detector 18 provides to the line 25a a square wave 85 extending from time t, to time t2. This square wave 85 is converted, by the proportioning circuit of FIG. 4 into a ramped voltage 86 which appears on line 22a. This ramp voltage 86 begins at time t1 and continues to rise from a base line 80 until the square wave input pulse 85 terminates at time t2. The height h to which the ramp 86 rises is equal to the total number of secondary electrons emitted by the scanned area 44. A percentage of the secondary electrons detected by the detector 18 will be received from the glass and the remainder will be detected from the pattern material.

Once the scan of area 44 is complete the beam 32 is turned off and the proportioning circuit 22 is reset by opening switch 52. The beam is now stepped a distance to the right that is equal to the width of pattern 15a so that it now scans an area 45 along the right hand edge of pattern 15a. This area 45 also has a width W and a length L. Once again as the beam scans this area 45 the secondary electrons from the surface are detected by detector 18 and sent as square wave 87 time t3 to time t4 to the proportioning circuit at input 25c. However, in this case because the switch 52 is closed, the singal is passed both through and by the inverter 50 to the integrator 51. The output of the proportioning circuit is indicated by the declining ramp 88. If as shown the ramp 88 returns to the base line 80 from whence it started means that thea area 44 overlapped exactly the same amount of pattern 15a as did the area 45.

If the scans did not cover exactly the same amounts of pattern and conductive glass layer 53 the ramp voltages would not be equal and a return to the base line would not be realized and an indication of the amount of adjustment necessary to cause the sub-field to become exactly registered to the desired or expected position would be indicated.

Figure 9:
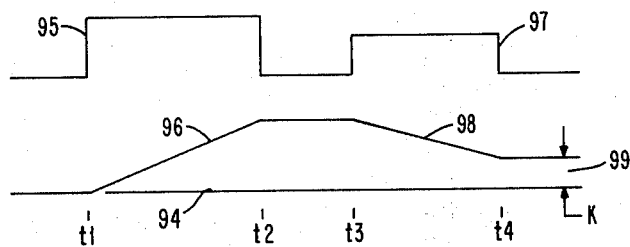
FIG. 9 illustrates the input and output signals of the scans of FIG. 10.

This will be best explained by reference to FIGS. 9 and 10.

Figure 10:
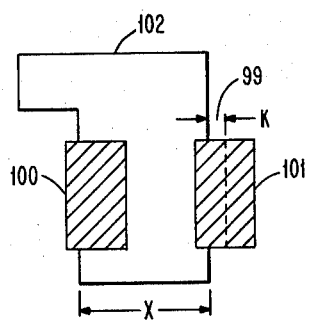
FIG. 10 illustrates offset scans on a selected circuit portion.

In FIG. 10, scans 100 and 101 are shown overlapping a pattern 103. As shown the area 100 overlies more of the pattern 102 than does the area 101. As shown in FIG. 9, the scanning of area 100 causes a square wave 95 extending fromt time t1 to time t2 which is translated by the proportioning circuit 22 into a ramp voltage 96 rising from a base line 94.

Because the second area 100 covers more of the pattern the number of secodary electrons created by the beam scanning is quite high.

Again the beam is moved and the are a 101 scanned. In this it should be noted that the height of the output square wave 97, time t3 to time t4, is lower than that of square wave 95 is indicative of the fact that a lesser amount of electrons is being received by the detector 18. Thus the ramp voltage 98 does not return to the base line but instead terminates at a height 99 above the base line. This height 99 is proportional to the displacement K of the edge of the pattern 102 from the center line of the scans. This displacement information can now be sent to the beam controller via line 23 to cause the beam to be adjusted to correct for this displacement. If desired information could be sent to the processor 24 which then causes the controller to reset the beam.

By scanning first along the right edge and then along the left edge of the pattern 15a and then integrating the detected secondary electron signal that came from these scans the location of these scans with respect to the image pattern in the left-right dimension can be determined as above described. This process can, if desired, be repeated again using a different left hand scan 46 on pattern 15c and a right hand scan 47 on pattern 15b. Once the sub-field has been properly positioned in the left-right dimension it is scanned in the manner described above so as to position it in a top-bottom dimension. This is accomplished by first passing the beam over the area 48 positioned on the top of pattern 15a and then over the area 49 on the bottom of pattern 15c as shown in FIG. 6. Again these areas must have equal widths and equal lengths so that the signals derived from such scans are proportional to the amount of overlap of the scan on the patterns. Once these scans are completed the derived information is used by the beam controller 17 to position the scanned patterns up or down to the desired inspection position. Such exact sub-field registration minimizes the positional error of the scanning beam and the actual image and results in a very precise alignment of the field.

Once this field registration is concluded the entire field is now inspected. To begin the inspection step the switch 25 is reset to disconnect the proportioning circuit 22 and to connect the comparator 21 to the detector 18 and amplifier 19. A voltage level equal to the previously determined threshold level is applied to input 41 of the comparator circuit 21. The processor, which has stored therein a complete description of the patterns to be inspected, first causes the beam 28 to scan the patterns 15a, 15b, and 15c which comprise the sub-field being inspected. The beam spot is of fixed size and is stepped only over the areas in the sub-field where the patterns are expected to be. The secondary electron current from each scanned pattern is monitored, analyzed and compared to the information stored in the processor 24 so that any time it falls below the threshold level the coordinates of the beam at that time are recorded to indicate a "missing-pattern"defect. Once each of the patterns 15a, 15b, etc, are all scanned the beam is directed to be stepped over only the areas where no pattern or pattern like material is expected to be. Again the secondary electron current is monitored, analyzed and compared to the stored information in the processor 24. Any time that the current rises above the threshold level the coordinates of the beam are again recorded to indicate an "additive defect", i. e. in this instance it indicates that pattern like material is existing on areas that should be clear of such material.

The described system can detect defects in the order of 1.0 micron diameter when an electron spot having an area of approximately 1.5 microns is used and the beam scan overlaps the previous scan by 0.75 to 1 micron in both axes. The use of over-lapping beam scans assures that no defect will be missed. The use of a spot that is comparable to the size of the defect to be detected enhances the thruput of the system and avoids the necessity of sophisticated pattern recognition hardware or software which would be necessary if a smaller spot were used. Overlap assures detection of minimum size defects without substantial false-claim rate.

As each sub-field is registered and scanned as described the defects are recorded and their position noted. Additionally, the invention teaches that by using a spot comparable to the size of the minimum defect to be detected and by overlapping the spots every defect above the minimum will be detected. Use of a large spot and overlapping scan results in some advantages. For example, a signal from an inspection spot is usually larger and easier to detect as its size increases and the larger the spot the faster the inspection proceeds. Additionally, detection of a single spot where the return signal is abnormal is proof of a defect without requiring the recognition of grouping of defect information which would consequently increase the complexity of signal handling.

It should be noted that each sub-field is inspected by stepping the beam first over all areas which are supposed to have patterns while monitoring the signal for absence of the pattern and then over the remaining areas, i. e. complement of the expected image while monitoring for the presence of unwanted patterns or pattern like material.

Figure 7:
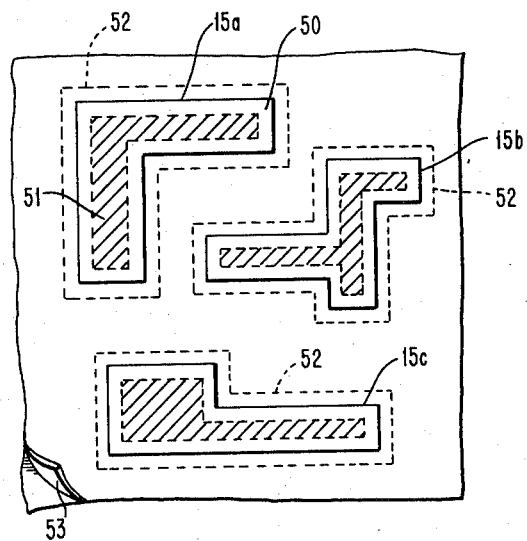
FIG. 7 illustrates the sub-field of FIG. 6 showing the boundaries of the positive and negative image as measured by the invention during the error inspection step of the invention.

As indicated in FIG. 7 it is desirable that a slight border area be left unscanned by the electron beam around each scanned pattern 15a, 15b, and 15c. Thus, in FIG. 7, a boarder region 50 bounded by dotted lines 51 and 52, is shown around pattern 15a overlies at the edge of the scanned metal pattern 15a but also a region around and contiguous to the pattern 15a. Thus, the scan of pattern 15a is indicated by the cross hatched area within dotted line 51 and the scan of the surrounding area lies outside the dotted line 52. By leaving such a border the electronics required and the programming of the processor 23 is greatly simplified.

Once the sub-field is inspected the beam is positioned over the next sub-field to be inspected and the process described above repeated until the entire field 14 has been inspected.

The invention teaches a unique concept of inspecting masks.

It should be clearly understood that the invention can be used with many other mask or pattern materials and can employ means other than electron beams for inspection. Thus, optical, infrared, X-ray or the like could be used. Also the mask could be transmissive instead of reflective. Still further it should be understood that the inspection equipment may require or use of form of radiation which would be different from the radiation employed when using the mask for exposure purposes. Thus, for example reflective electron beams can be used for inspection while a transmissive optical beam would be used for exposure purposes.

While the invention has been particularly described with reference to the preferred embodiment thereof it will be understood by those skilled in the art that the foregoing and other changes in form and details be made therein without departing from the spirit and scope of the invention.

What is claimed is:

1. A method of inspecting a patterned mask comprising the steps of:
   placing a patterned mask to be inspected in an inspection apparatus,
   said mask being provided with a multiplicity of patterns on a surface thereon,
   directing a beam to scan a first selected region overlying a portion of a selected first pattern on said mask,
   measuring the information received from said first region,
   comparing the measured information against the information used to create said mask and using the compared information to align said mask to a first predetermined position,
   directing the beam to scan the entire selected pattern, measuring the information received from said entire first selected pattern, comparing said received information to the information used to create said mask to detect errors in said selected pattern, moving said mask to a different position, directing the beam to scan a second selected region overlying a portion of a selected second pattern on said mask, comparing the measured information against the information used to create said mask and using the compared information to align said mask to a second predetermined position, directing the beam to scan the entire second selected pattern, measuring the information received from said entire second selected pattern, and comparing said received information from said second pattern to the information used to create said mask to detect errors in said second selected pattern.

2. The method of claim 1 wherein said beam is an optical beam.

3. The method of claim 1 wherein said beam is a beam of X-rays.

4. The method of claim 1 wherein said beam is an electron beam.

5. The method of claim 1 wherein said mask is comprised of a substrate and said patterns are formed of films thereon and said beam is selected so that said substrate is transparent to said beam.

6. The method of claim 5 wherein said films are opaque to said beam.

7. The method of claim 4 wherein said mask comprises a substrate coated with a conductive layer on which film patterns are deposited, said layer, said substrate and said film patterns having different reflective characteristics when impinged upon by said beam, and said measured information is in the form of reflected electrons from said scanned region.

8. The method of claim 5 wherein said substrate is glass and said beam is an optical beam in the visible range.

9. The method of claim 5 wherein said substrate is silicon and said beam is in the infrared range.

10. The method of claim 4 wherein said mask comprises a conductive substate on which film patterns are deposited, said substrate and said film patterns emit different levels of secondary electrons when scanned by said beam, and said measured information is in the form of secondary electrons from said scanned region.

* * * * *